United States Patent [19]

Murphy

[11] Patent Number: 5,287,617
[45] Date of Patent: Feb. 22, 1994

[54] APPARATUS FOR EXTRACTING AN INTEGRATED CIRCUIT PACKAGE INSTALLED IN A SOCKET ON A CIRCUIT BOARD

[75] Inventor: James V. Murphy, Warwick, R.I.

[73] Assignee: Advanced Interconnections Corporation, West Warwick, R.I.

[21] Appl. No.: 928,520

[22] Filed: Aug. 11, 1992

[51] Int. Cl.$^5$ ............................................... H05K 3/30
[52] U.S. Cl. ...................................... 29/741; 29/762; 29/764
[58] Field of Search ................. 29/764, 762, 264, 266, 29/829, 426.4, 741

[56] References Cited

U.S. PATENT DOCUMENTS

| | | |
|---|---|---|
| 4,597,173 | 7/1986 | Chino et al. |
| 4,633,239 | 12/1986 | Nalbanti |
| 4,832,610 | 5/1989 | Matsuoka |
| 4,985,989 | 1/1991 | Murphy |

OTHER PUBLICATIONS

Hypertronics Corporation, "Low Insertion Force Connectors".
Hypertronics Corporation, "Connection Technology", May, 1989.
Electronics Purchasing, "Buying in the Computer Industry", Oct., 1989.
Micro Electronics Systems, Inc.
Hypertac Limited, "Cover for HDC/HDD Connectors".
Emulation Technology, Inc., "1989 Winter/Spring Catalog".
Augat Interconnection Components, "Interconnection Hardware Catalog AC23", p. 80.
Methode Electronics, Inc., "Interconnect Products Catalog", pp. 16-19.
Augat Interconnection Components, "Pin Grid Socket Catalog PG 25".
Advanced Interconnections, "Extraction Tools for PGA Sockets", pp. 114-116, 1990.
International Electronic Research Corp., "High Speed Microprocessor Heat Dissipators", Bul. No. 505, Feb. 1992 and Bul. No. 503, Jan. 1992.
AMP Product Information Bulletin, "AMPFLAT Land Grip Array (LGA) Socket Assembly", 1991.
Micro Electronics Systems, Inc., "Insertion Tools" and Extraction Tools.
Micro Electronics Systems, Inc., "PGA Inserter" and PGA-Extractor.
Techni-Tool, "P.G.A. Extractor".
Augat, Inc., Interconnection Products Division, "Interconnection Choices", Circle No. 155.
Design, "Components".
Augat, Inc., Interconnection Products Division, "Pad Array Interfaces-PAIS Series Land Grid Array Sockets".

*Primary Examiner*—Carl E. Hall
*Attorney, Agent, or Firm*—Fish & Richardson

[57] ABSTRACT

An apparatus for inserting and extracting an integrated circuit package (IC) of the type having pins from terminals of a socket installed on a circuit board. The apparatus includes a package support member positioned between the package and socket, a cover attached over the package, and a socket support member between the socket and the circuit board to support the socket. The package support member has thru-holes to permit the package pins to extend through the member and engage terminals installed in the socket. The apparatus further includes an insertion/extraction member coupled to the package support member. The insertion/extraction member can be placed in a position between the package support member and the socket support member such that movement of the insertion/extraction member causes the pins to engage corresponding terminals of the socket and when placed in a position between the socket support member and the circuit board, movement of the insertion/extraction member causes pins to withdraw from the terminals.

16 Claims, 6 Drawing Sheets

APPARATUS FOR EXTRACTING AN INTEGRATED CIRCUIT PACKAGE INSTALLED IN A SOCKET ON A CIRCUIT BOARD

BACKGROUND OF THE INVENTION

This invention relates to the insertion and extraction of integrated circuit packages from circuit boards.

As is known in the art, integrated circuit (IC) packages can have anywhere from a few to in excess of one thousand pins. The IC packages are often soldered directly to a circuit board to assure a relatively permanent connection between the IC package and board. However, in some applications, it may be desired that the package be mounted indirectly to the board through an electrical socket. In this way, the integrated circuit can be replaced or removed for testing without the need for reheating solder joints which may, in some cases, cause damage to the integrated circuit and board.

Inserting and removing IC packages from a socket is generally not a problem if the package has a small number of pins, because the forces associated with each pin and socket terminal are relatively insignificant. However, for IC packages having a larger number of pins, such as many of the pin grid array (PGA) packages introduced in the last few years, the aggregate force of the many pin/socket terminal connections can become so high that insertion and particularly extraction of the integrated circuit is difficult. In such situations, insertion and extraction can cause damage (i.e., cracking, nicking) to the PGA package.

A number of tools are available for inserting and extracting integrated circuits from sockets. One type of insertion tool is operated by positioning the tool over the package and rotating a knob in a first direction to allow a pair of claws to grip the package. Continued rotation of the knob causes a plunger to apply a downward force on the package, inserting it into the socket. Rotation of the knob in the opposite direction releases the package from the claws of the tool. An extraction tool similarly has a knob and a pair of claws which are positioned over the package. Rotation of the knob causes the claws to grip the package and to move away from the socket and extract the package.

Another extraction tool is simply a lever member having an end with gripping teeth. The teeth are positioned between the package and the board and a downward force is applied to the lever member so that the package is pried away from the board.

Still another apparatus for extracting an IC package is discussed in my U.S. Pat. No. 4,985,989, entitled "Method and Apparatus for Removing a Multi-Pin Component Installed in Sockets on a Circuit Board", issued on Jan. 22, 1991. Rotation of a screw provides an upward force on the lower surface of the integrated circuit extracting it from the socket.

SUMMARY OF THE INVENTION

In general, in one aspect, the invention features an apparatus for extracting an IC package, of the type having pins mating with terminals of a socket installed in a circuit board. The apparatus includes a package support member positioned between the package and the socket and has holes to permit the package pins to extend through the support member and engage the terminals of the socket. A retaining element is coupled to the package support member for maintaining the package within the support member. An extraction member may be coupled to the package support member in a manner such that movement of the extraction member causes the package support member to move in an upward direction relative to the socket thereby causing the package to be extracted from the socket.

Preferred embodiments of the invention include additional features. The apparatus includes an insertion member coupled to the package support member in a manner such that movement of the insertion member causes the package support member to move towards the socket thereby inserting the package into the socket. The socket is disposed within a socket housing having a plurality of holes for permitting socket terminals to extend through the socket housing to engage a printed circuit board. The socket housing includes alignment holes to permit the package support member and cover to be mounted to the socket with alignment pins. The alignment pins and corresponding alignment holes provide guidance in attaching the package support member to the socket housing reducing the possibility of damage to the package pins during installation. The cover includes a heat sink having an increased surface area to dissipate heat generated by the package during operation.

In some preferred embodiments, the extraction member is a mechanical screw for engaging a tapped hole disposed within the package support member. Rotation of the screw provides a downward force on an upper surface of the socket and an opposite upward force on the package support member to cause the package to move away from the socket. The mechanical screw can be moved to a second tapped hole that extends into the socket, so that rotation of the screw within the tapped hole urges the package support member and IC package toward the carrier thereby engaging the package pins within the terminals of the socket. Alternatively, the mechanical screw can be captured between a package support member and cover so that rotation of the screw draws the IC package and its pins toward the socket and its terminals, while an opposite rotation of the screw causes the oversized head of the screw to abut the bottom surface of the cover causing the package support member and IC package to recede from the socket.

In other preferred embodiments, the package support member and the socket housing both have recesses extending along parallel edges, such that when the socket housing is disposed onto the circuit board, the recess provides a first track or groove between a surface of the socket housing and the board. Similarly, when the package support member and IC package are disposed over the socket housing, a second track is provided between the socket housing and package support member. Inserting the pair of ganged levers within the first track and applying a downward force to the arms causes the package support member to be urged toward the socket and the pins of the IC package to be inserted within the terminals of the socket. Moving the pair of arms to the second track and applying a downward force causes the IC package to move away from the socket and the pins to withdraw from the terminals of the socket. The arms include roller pin assemblies for transferring the downward force applied to the arms to the cover during insertion of the IC package.

The invention permits the extraction of IC packages having a large number of pins. Providing the package within an intermediate package support member provides increased control in insertion and extraction of the package by providing support surfaces that can be firmly held or gripped. Further, the package support member permits the forces necessary for extracting the package to be applied to the package support member rather than directly to the package.

Other advantages and features of the invention will be apparent from the following description and from the claims.

DESCRIPTION OF THE PREFERRED EMBODIMENTS

Figure 1:
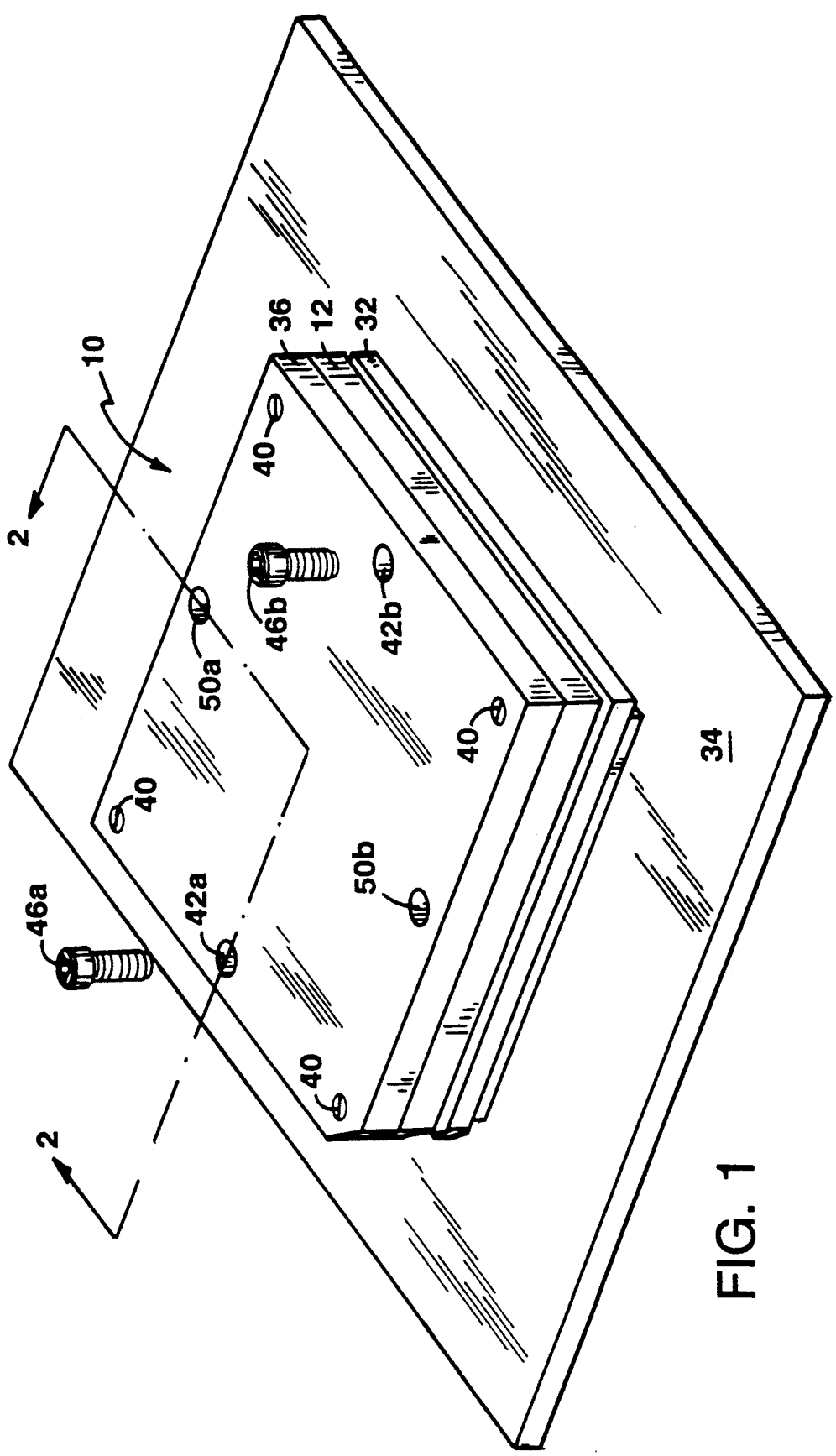
FIG. 1 is a perspective view of a preferred embodiment of the invention in which mechanical screws provide insertion and extraction of an integrated circuit package.
Figure 2:
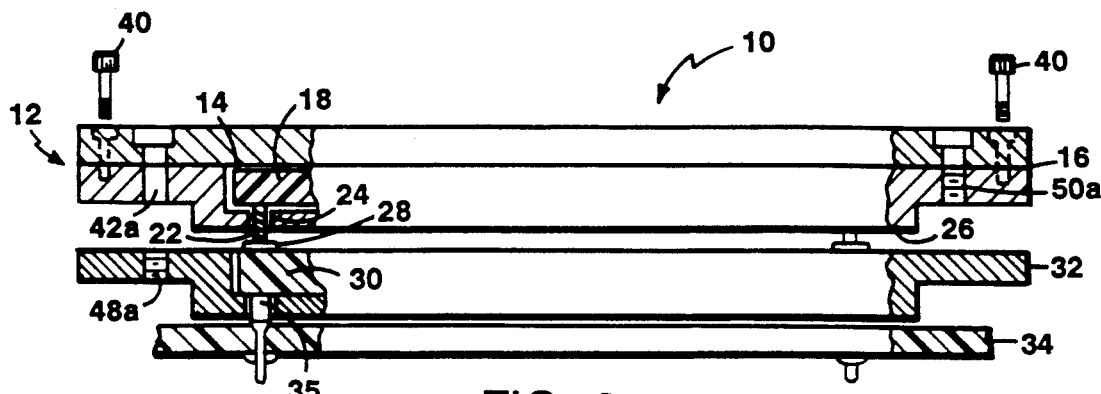
FIG. 2 is a cross-sectional side view of the mechanical screw arrangement taken along lines 2—2 in FIG. 1.

Referring to FIGS. 1 and 2, there is shown an IC package insertion/extraction apparatus 10 having a housing 12 with a cavity 14 disposed on an upper surface 16 for supporting an IC package, such as a pin grid array (PGA). The PGA comprises a ceramic housing 18 having a plurality of male contact pins 22. The pins 22 may be arranged in any of a variety of footprints. Housing 12 includes a plurality of thru holes 24 for allowing pins 22 to pass through a lower surface 26 of the housing 12 to engage corresponding terminals 28 disposed in socket 30. A socket housing 32 disposed between package housing 12 and a electrical circuit board 34 supports socket 30 and has a plurality of thru holes 35 to permit terminals 28 to be attached to circuit board 34. A cover 36 is attached to package housing 12 using pins, clasps or as shown here, screws 40 to firmly secure the PGA within the cavity 14 of the housing.

A pair of holes 42a, 42b are disposed in the housing and cover for receiving screws 46a, 46b. Socket housing 32 has tapped holes 48a, 48b for receiving screws 46a, 46b. To connect PGA package 18 to circuit board 34, the package is placed in cavity 14 of the housing 12, cover 36 is attached, and the assembly is positioned over socket housing 32 and socket 30. Male contact pins 22 are received in terminals 28 and screws 46a, 46b are rotated to engage tapped holes 48a, 48b causing package housing 12, cover 36 and package 18 to be drawn toward socket housing 32 and contact pins 22 to be firmly engaged within terminals 28. It is generally desirable to provide at least two screw 46 and hole 42 arrangements, but a larger number could be used. The screws should be appropriately positioned so that pressure is evenly applied and the package 18 is not skewed with respect to the socket 30.

To extract the package 18 from socket 30, screws 46a, 46b are removed from holes 42a, 42b and moved to holes 50a, 50b where they are rotated within the threaded holes 50a, 50b until end portions of the screws contact a top surface of socket housing 32. Socket housing 32 does not include tapped holes at these locations for receiving the screws 46a, 46b during extraction, as was the case where holes 48a, 48b were provided for inserting the package. Continued rotation of the screws 46a, 46b produces an upward force on package housing 12 causing pins 22 to withdraw from terminals 28. As was the case, with inserting package 18 to socket 30, it is generally desired that at least two screws 46a, 46b and tapped holes 50a, 50b are provided to disengage the package uniformly from the socket 30 and to prevent the occurrence of localized stress points between the pins 22 and terminals 28.

Figure 2A:
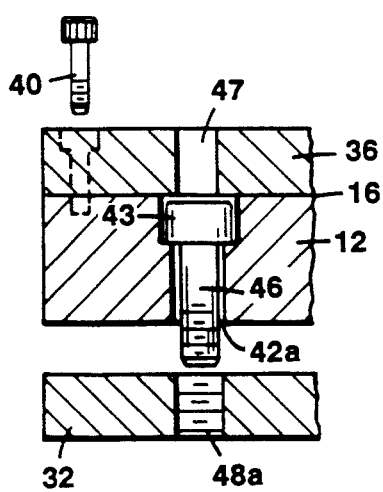
FIG. 2A is another embodiment of the mechanical screw arrangement of FIG. 1.

Referring now to FIG. 2A, another embodiment of the insertion/extraction apparatus includes the package housing 12 having a counterbore 43 disposed on upper surface 16. Counterbore 43 is aligned with both hole 42a of housing 12 and tapped hole 48a of socket housing 32. The counterbore 43 allows the head of socket head cap screw 46 to be set below the level of surface 16. Cover 36 has a thru hole 47 having a diameter less than the diameter of the head of screw 46 but sufficiently large enough to allow a tool to engage the head of screw 46. In this way, when screw 46 is placed within hole 42a and cover 36 is attached to package housing 12, screw 46 is captured and cannot be removed without first removing cover 36. Insertion of package 18 to socket 30 is provided in the same way as discussed above in conjunction with FIG.1. However, to extract the package 18 from socket 30, rotation and removal of screw 46 causes its head to contact the bottom surface of cover 36 which, with continued withdrawal of screw 46, produces an upward force against cover 36 causing attached housing 12, package 18 and ultimately contact pins 22 to withdraw from terminals 28.

Referring now to FIGS. 3A-3D, an alternative insertion extraction apparatus 100 has package housing 12 and cover 36 attached to socket housing 32 through male contact pins 22 and terminals 28 of socket 30 as was described in conjunction with FIGS. 1 and 2. The package housing 12 and socket housing 32 both have recesses extending along the length of parallel edges of the housings, such that when socket terminals 28 are soldered to board 34, a first groove or track 52 is provided between socket housing 32 and board 34. Similarly, a second track 54 is provided between package housing 12 and socket housing 32. A pair of lever arms 56a, 56b, have first ends of the lever arms joined together using a cross bar 62 to gang the pair of arms. The open ends 58a, 58b are firmly coupled within first track 52 so that when a downward force is applied to the cross bar 62, the lever arms 56a, 56b swivel within track 52. The pair of arms 56a, 56b each have a roller/pin assembly 60a, 60b attached to inner portions of each arm, with a free-spinning roller in contact with a top surface of cover 36 such that an applied downward force is transferred to cover 36 through roller/pin assemblies 60a, 60b. The downward force causes contact pins 22 to engage socket terminals 28.

Figure 3A:
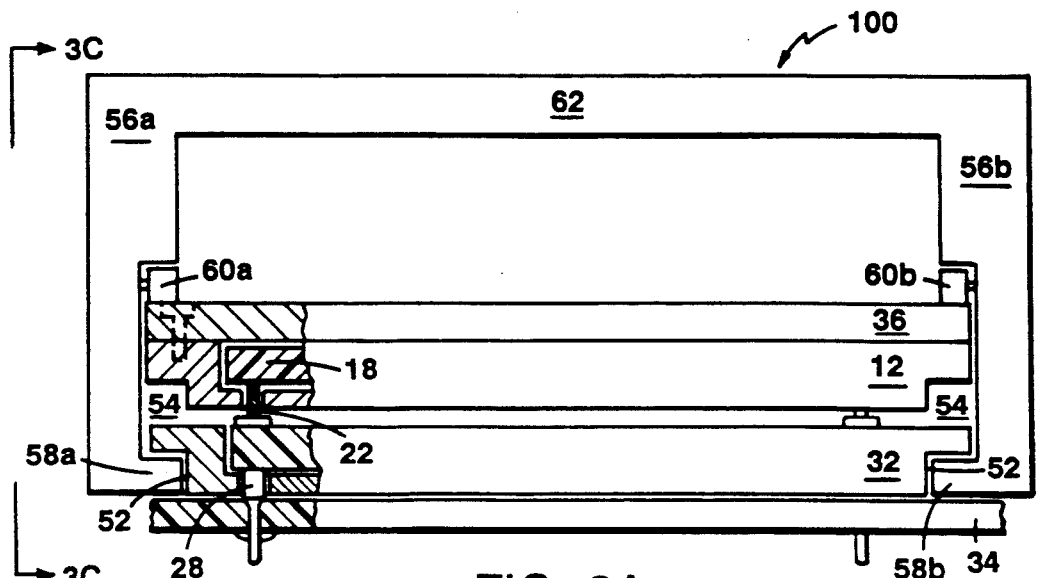
FIG. 3A is another embodiment of the invention in which insertion is provided with a pair of lever arms.
Figure 3B:
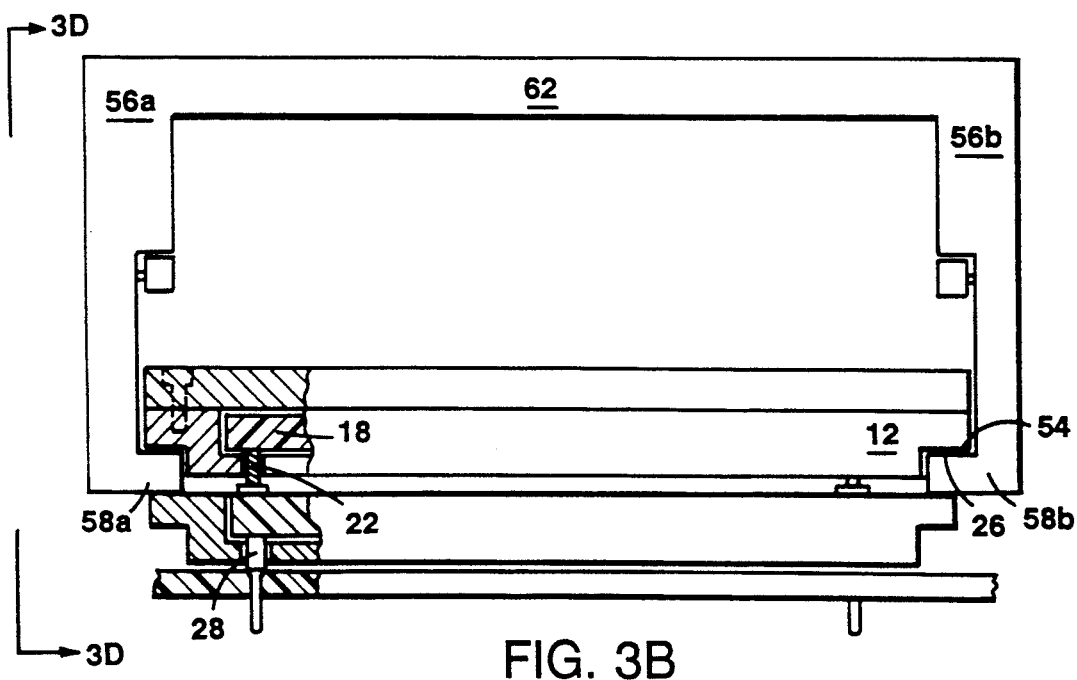
FIG. 3B is another embodiment of the invention in which extraction is provided with the pair of lever arms.
Figure 3C:
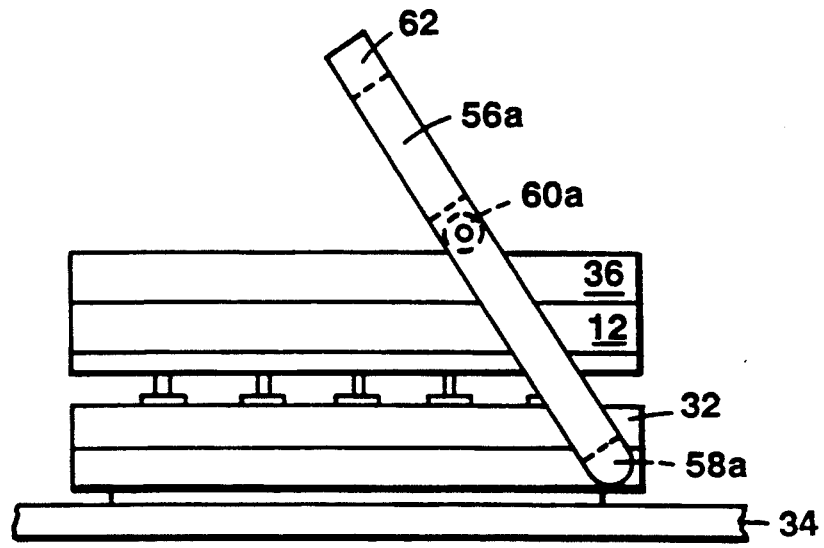
FIG. 3C is a side view of the embodiment of the lever arm arrangement of FIG. 3A.
Figure 3D:
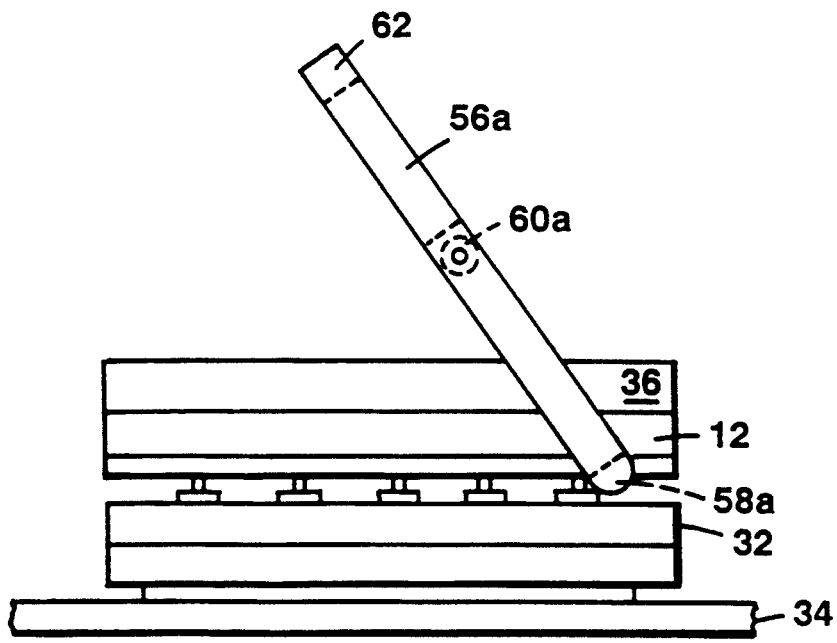
FIG. 3D is a side view of the embodiment of the lever arm arrangement of FIG. 3B.

Referring now to FIGS. 3B and 3D, extraction of the PGA package 18 from socket 30 is accomplished by removing open ends 58a, 58b of lever arms 56a, 56b from first track 52 and moving them to second track 54. The lever arms 56a, 56b are generally placed at a first end of the second track 54 and a downward force is applied to the arms. The end portions 58a, 58b of arms 56a, 56b have a geometry such that the downward force causes an upward force to be imparted to the bottom surface 26 of the package housing 12. As the housing 12 withdraws away from the socket housing 32, the lever arms 56a, 56b are repeatedly shifted along the second track in a direction away from the first end and a downward force reapplied to the lever arms 56a, 56b. Moving the lever arms along the track and applying a downward force at each position, ultimately results in contact pins 22 disengaging socket terminals 28.

Figure 4:
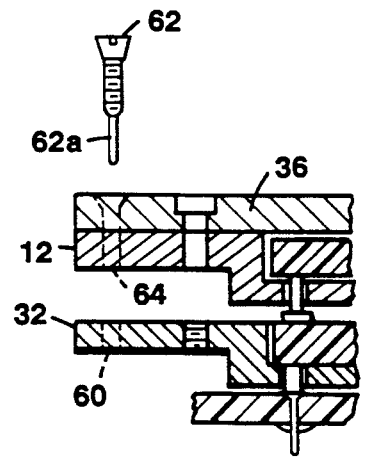
FIG. 4 is a cross-sectional side view of another embodiment the invention having guide pin screws.
Figure 5:
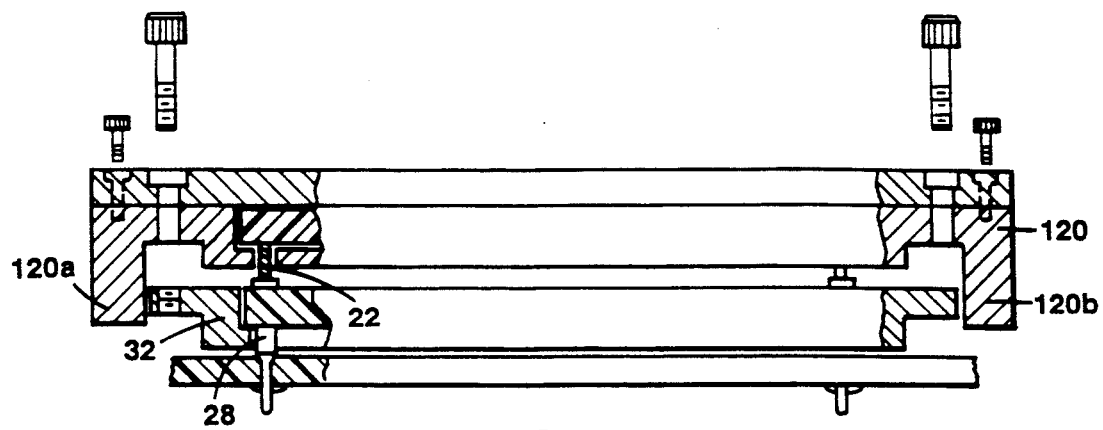
FIG. 5 is a cross-sectional view of another embodiment of the invention.

Referring now to FIG. 4, socket housing 32 has an alignment hole 60 for receiving a guide pin screw 62. Guide pin screw 62 secures cover 36 to housing 12 in tapped hole 64 aligned with alignment hole 60. The guide pin screw 62 has an end portion 62a that has a slip fit within alignment hole 60. The guide pin screw 62 facilitates the alignment of pins 22 of the PGA package 18 to terminals 28 of socket 30 during the assembly of the housing 12 to socket housing 32. The guide pin screw alignment approach is applicable to both insertion/extraction apparatus having screw (FIGS. 1 and 2) or lever (FIGS. 3A-3B) arrangements An alternative alignment approach, shown in FIG. 5, has a package housing 120 having projected edges 120a, 120b that enclose the outer periphery of the socket housing 32. The projected edges form a box-like structure having inner dimensions that are proximate to the outer dimensions of the socket housing 32. As was the case with the embodiment of FIG. 3, insertion of the socket housing 32 within the package housing 120, aids in the alignment of contact pins 22 with terminals 28.

Figure 6:
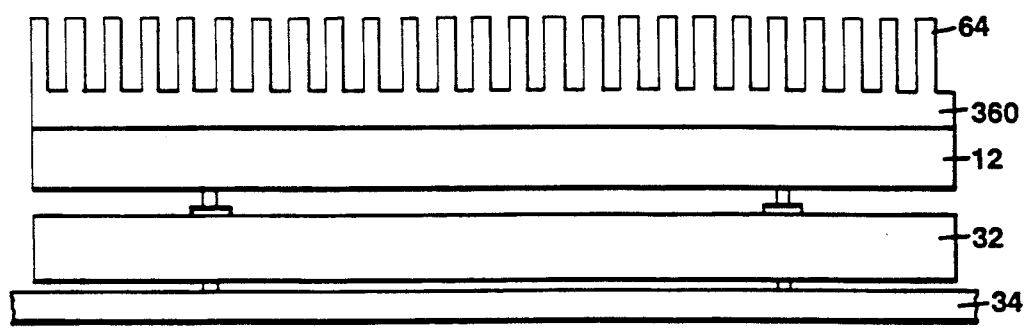
FIG. 6 is a side view of an embodiment of the invention having a heat sink.

Referring to FIG. 6, a cover 360 has a heat sink structure 64 attached to housing 12. As is known by those of ordinary skill of the art, heat generated by integrated circuits generally increases with increased pin counts. The heat sink structure 64 has an increased surface area to provide a thermal path for dissipating the heat generated by the circuit. In some applications, it may be desirable to provide a thermal lubricant between the PGA package 18 and the cover to further improve the thermal path to the heat sink 64. While preferred embodiments have been described above, other variations and modifications are within the scope of the following claims.

What is claimed is:

1. An apparatus for extracting an IC package having pins for mating with corresponding terminals disposed in a socket installed in a circuit board, the apparatus comprising:
    a package support member configured to receive said package and positioned between said package and socket, said support member having a portion adapted to receive an extraction member to extract said support member and package from said socket and thru apertures to permit said pins of said package to extend through said member to engage said terminals of said socket; and
    a retaining element mechanically coupled to said package support member, for maintaining said package within said package support member.

2. The apparatus of claim 1 further comprising said extraction member, said member being configured so that it may be coupled to said package support member, so that movement of said extraction member causes said package support member to move upwardly relative to said socket and thereby extract said package from said socket.

3. The apparatus of claim 2 further comprising an insertion member, said member being configured so that it may be coupled to said package support member, so that movement of said insertion member causes said package support member to move towards said socket thereby inserting said package into said socket.

4. The apparatus of claim 3 further comprising a socket support member configured to be positioned between said socket and said circuit board to support said socket and in combination with said package support member permits said extraction member to extract said package from said socket.

5. The apparatus of claim 4 wherein said retaining element is a cover mechanically coupled to said package support member.

6. The apparatus of claim 4 wherein said extraction member comprises an extraction screw member and said package support member comprises a threaded hole for receiving said extraction screw member and wherein rotation of said extraction screw member moves said package support member away from said carrier and disengages said plurality of pins from said corresponding socket apertures.

7. The apparatus of claim 4 or 6 wherein said insertion member comprises an insertion screw member, disposed through said package support member and said socket support member includes a tapped hole, and wherein rotation of said insertion screw member in a first direction engages said tapped hole of said socket and moves said package support member toward said socket to engage said pins within said socket terminals.

8. The apparatus of claim 7 wherein said insertion screw member has a threaded portion with a first diameter and a head having a second diameter,
    said package support member has a first thru-hole and a bore having a predetermined depth disposed on said first surface of said package support member and coaxial with said first thru-hole, and
    said cover has a second thru-hole coaxial with said first thru-hole, said second thru-hole having a diameter greater than said first diameter and less than said second diameter, and
    wherein rotation of said insertion screw member in an opposite direction relative to said first direction moves said package support member away from said carrier and disengages said pins from said terminals of said socket.

9. The apparatus of claim 4 wherein said extraction member comprises a lever arm having a first end configured to be disposed between said socket support member and said package support member, so that application of a downward force to a second end of said lever causes said IC package to move away from said socket.

10. The apparatus of claim 4 wherein said insertion member comprises
    a lever arm having a first end configured to be disposed between said socket support member and said circuit board and
    a portion located along said arm and configured so that said arm may be mechanically coupled to said package support member, so that application of a downward force to said second end of said lever causes said IC package to move toward said socket.

11. The apparatus of claim 9 wherein said lever arm further comprises a portion located along said arm and configured so that said arm may be mechanically coupled to said package support member, so that application of a downward force to said second end of said lever causes said IC package to move toward said socket.

12. The apparatus of claim 10 or 11 further comprising a pair of rollers, each roller coupled to said portion along said arm for transferring said downward force applied to said second end of said arm to said package support member.

13. The apparatus of claim 5 wherein said cover further comprises a heat sink coupled to a top surface of said cover.

14. The apparatus of claim 13 wherein said heat sink is an integral part of said cover.

15. The apparatus of claim 5 further comprising an alignment guide pin disposed through said cover and package support member and within an alignment hole disposed within said socket support member such that said pins of said package are aligned with said terminals of said socket.

16. The apparatus of claim 5 wherein said package support member has side members defining a cavity, said cavity having inner dimensions approximate to outer dimensions of said socket support member, such that said package support member disposed over said socket support member causes said pins of said package to be substantially aligned with said terminals of said socket.

* * * * *